United States Patent [19]

Poirier et al.

[11] Patent Number: 4,557,141

[45] Date of Patent: Dec. 10, 1985

[54] METHOD FOR DIAGNOSING FAULTS IN ELECTRONIC FUEL CONTROL SYSTEMS

[75] Inventors: Roger Poirier, Ormeaux; Donald F. Hamill, St. Laurent, both of Canada

[73] Assignee: Pratt & Whitney Canada Inc., Longueuil, Quebec, Canada

[21] Appl. No.: 652,016

[22] Filed: Sep. 19, 1984

[51] Int. Cl.$^4$ ............................................. G01M 15/00
[52] U.S. Cl. ...................................... 73/117.2; 73/119 A
[58] Field of Search ..................... 73/117.2, 117.3, 118, 73/119 A

[56] References Cited

U.S. PATENT DOCUMENTS 3,443,428  5/1969  Carlin, III et al. ................ 73/117.3
4,274,144  6/1981  Meyer et al. .................. 73/117.2 X Primary Examiner—Jerry W. Myracle
Attorney, Agent, or Firm—Fleit, Jacobson, Cohn & Price

[57] ABSTRACT

A method of troubleshooting, with a test set, an electronic fuel control system in an aircraft includes disconnecting the electronic engine control after mechanical tests have verified that the faults do not exist in the hydromechanical unit or associated mechanical parts. The test set then delivers signals to the circuits of the fuel control system one at a time to uniquely and specifically identify the fault. With this method, the engine can be tested when it is in its static condition.

4 Claims, 2 Drawing Figures

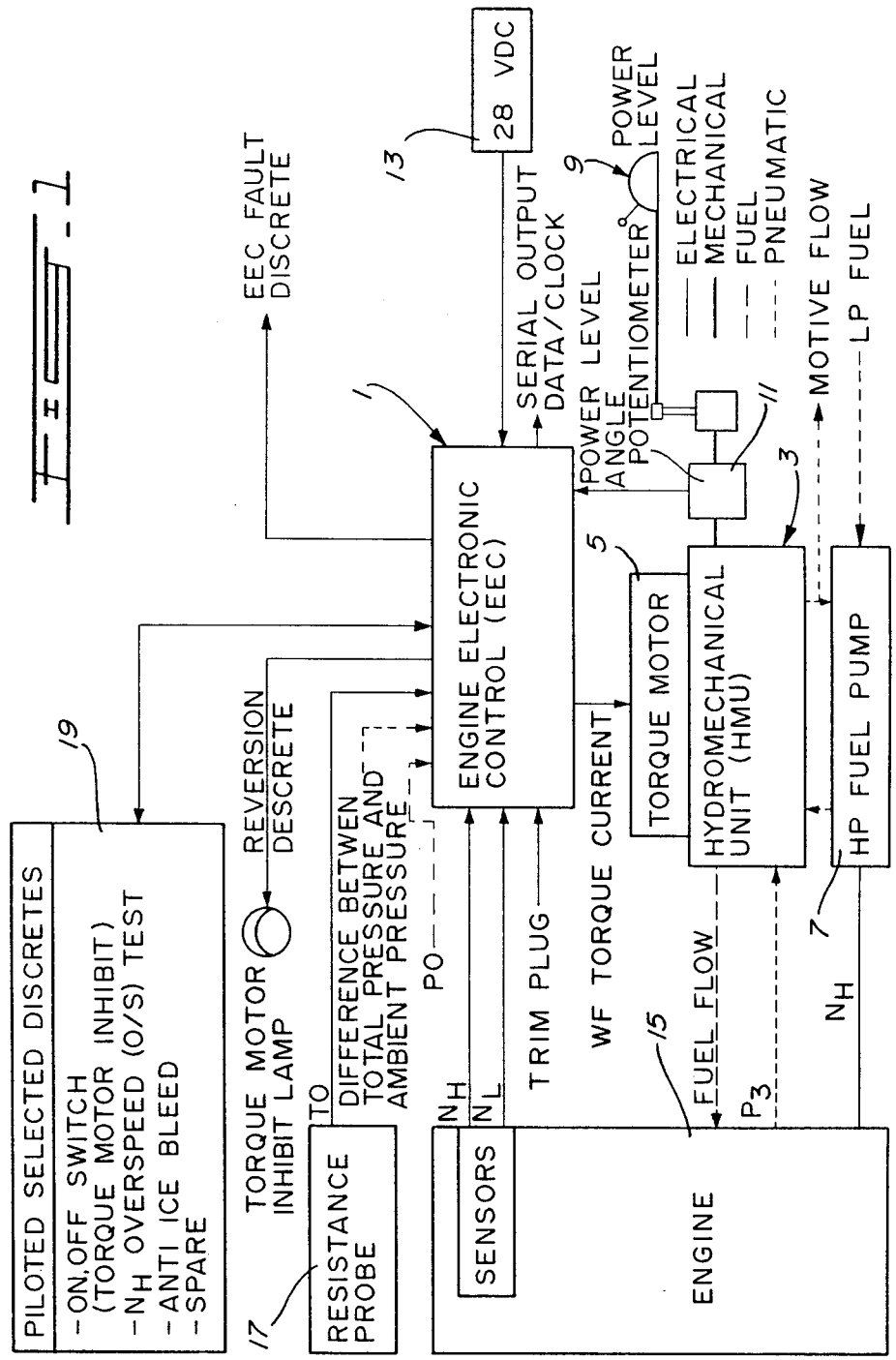

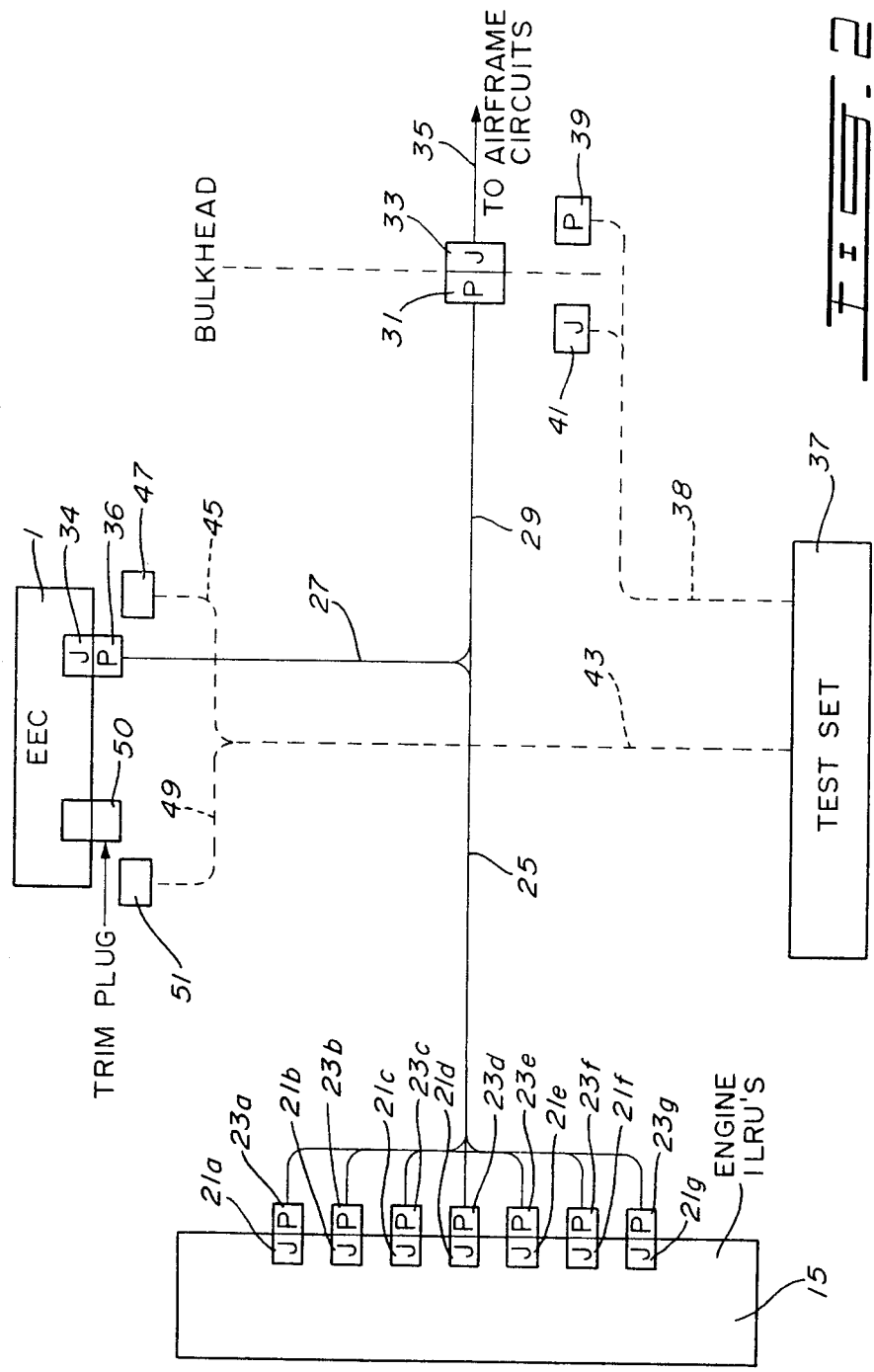

METHOD FOR DIAGNOSING FAULTS IN ELECTRONIC FUEL CONTROL SYSTEMS

BACKGROUND OF INVENTION

1. Field of the Invention

The invention relates to a method of troubleshooting, with a test set, an electronic fuel control system in an aircraft which includes an electronic engine control (EEC). More specifically, the invention relates to such a method wherein the EEC is disconnected and all instruments, sensors and harness elements are tested, and wherein if the harness elements, instruments and sensors have no faults, then it is assumed that the fault is in the EEC itself.

2. Description of Prior Art

Typically, troubleshooting electronic fuel control systems follow one or the other of a combination of the two following approaches:

1. Use of high cost (EEC) testers plus conventional test equipment such as ohmeters and voltmeters; and
2. On-board, (EEC) diagnostic equipment.

With the first method, the use of conventional equipment leads to a potential for damaging connectors with meter probes. In addition, the use of conventional equipment necessitates the requirement for lengthy and tedious procedures, there is therefore a tendency to be haphazard in the testing. Finally, the cost of the EEC tester is substantial and, as seen below, it does not in any case provide all of the needed information.

Concerning the second method, the diagnostic equipment typically indicates an area including a fault. However, it does not pinpoint the specific circuit containing the fault.

SUMMARY OF INVENTION

It is therefore an object of the invention to provide a troubleshooting method which overcomes the difficulties of the prior art.

It is a further object of the invention to provide a troubleshooting method which permits troubleshooting of the engine in its static condition.

The basic approach of the inventive method is to check all electrical circuits connected to the engine harness and the harness itself with the EEC disconnected. If no fault is found, it can be assumed that the EEC is at fault.

If the EEC is found to be at fault, it would be sent to an authorized repair agency for correction.

BRIEF DESCRIPTION OF DRAWINGS

The invention will be better understood by an examination of the following description, together with the accompanying drawings, in which:

FIG. 1 is a schematic block diagram of a typical fuel control system; and

FIG. 2 is a schematic wiring diagram showing the inventive test set-up.

DESCRIPTION OF PREFERRED EMBODIMENTS

Referring to FIG. 1, the fuel control system includes an electronic engine control 1 (EEC), sometimes referred to as an electronic control unit (ECU). It also includes a hydromechanical unit 3 (HMU), including a torque motor 5, and a fuel pump 7. Power lever 9 is a pilot controlled unit and sets the level of power desired by the pilot. The power lever 9 is connected to a potentiometer 11 whose output is connected to the EEC. The system is powered by the 28-volt DC 13 in the aircraft.

Sensors in the engine 15 provide various pieces of data to the EEC, for example, $N_H$ and $N_L$ (high and low turbine speeds, respectively). In addition, probes, such as resistance probe 17, provide other information to the EEC. For example, ambient temperature (TO), total pressure (PO) and differential pressure ($\Delta P$).

Finally, the EEC receives information conconcerning the position of various switches in the cockpit 19.

Turning now to FIG. 2, the engine comprises a plurality of line replaceable units, LRU's, terminated in jacks or receptacles 21a to 21g. The LRU's comprise, for example, sensors, for sensing different parameters within the engine, the HMU, antiicing valves, etc.

A like plurality of plugs, 23A to 23G are respectively connected to a separate one of the LRU's. Conductors, leading from connectors 23A to 23G, form an engine harness of conductive connectors 25. The engine harness is split into an EEC portion 27 and an engine/airframe interface (E/A I) portion 29. The E/A I portion is terminated in a multiposition interface plug 31 which is in turn connected to a mating multiposition interface receptacle 33.

Airframe harness 35 comprises conductors connected to respective ones of the pins of 33, and the respective conductors are led to, and connected to, respective airframe instruments.

EEC portion 27 terminates in multiposition EEC plug 36 which is in turn connected to mating multiposition EEC receptacle 34.

Respective pins of 34 are connected to respective circuits within the EEC.

In accordance with the invention, the troubleshooting of the fuel control system is performed with the aid of a test set 37. Leading out of the test set is a first harness 38. Some of the leads of 38 are fed to plug 39 and others are fed to receptacle 41. 39 mates with 33, and 41 mates with 31.

The test set includes a second harness of conductors 43 which is split up into a first set of conductors 45 leading to receptacle 47, and a second set of conductors 49 leading to receptacle 51.

When it is necessary to troubleshoot the fuel control system, 33 is disconnected from 31. 41 is then connected to 31 while 39 is connected to 33.

At the same time, 36 is disconnected from 34 and 47 is connected to 36. Plug 50 is disconnected from the EEC and receptacle 51 is connected to plug 50. Trim plug 50 includes coded data which must agree with a code on the engine data plate.

This constitutes the test set-up for testing the sensors, instruments and harnesses.

It is first necessary to determine if the hydromechanical portion of the fuel system is serviceable during reversion (manual) mode. If not, then the usual troubleshooting procedures are performed, that is, fuel lines, fuel pump, fuel nozzle adapter assemblies, hydromechanical unit, etc. are tested.

If the hydro-mechanical portion of the system does check out, then the electrical connections, as above-described, are affected.

Appropriate signals are sent out by the test set on one conductor at a time through the circuit to which this conductor is connected. For example, a signal sent out on a conductor of the harness 38, which is also connected to plug 41, will then travel along the harness portions 29 and 25 and to the appropriate one of the LRU's 21a to 21g. If a fault is found during these tests, then the fault resides either in the particular connector, or in the LRU to which the connector is connected. Tests, well known in the art, can be made to determine the operability or otherwise of the particular LRU, and if the LRU checks out, then it is obviously the conductor which is faulty. The conductor, or possibly the entire harness, can then be replaced.

In the same way, when a signal is sent out through a conductor on 38, which leads to plug 39, that signal will go, through receptacle 33, to a particular airframe instrument. Once again, if a fault is detected, then the fault can reside either in the connector or in the particular airframe instrument. Once again, tests, well known in the art, can determine whether or not the instrument is faulty.

The EEC harness portion is tested by sending signals through connectors in 43 to 45 and to receptacle 47. The signal will then travel, from receptacle 47 to plug 36 through harness portions 27 and 25 and through a respective one of LRU's 21a to 21g. (Alternatively, it may go in the opposite direction through portion 29 to airframe instruments). Once again, if a fault is detected, then the fault resides either in the connector or in the particular LRU.

The signals for testing various ones of the sensors or instruments, are well known in the art and require no further description here. In addition, a test set, which will provide signals on one conductor at a time, and which will receive a return signal to determine whether or not a fault exists in the circuit between the output of the test set and the input thereof, are also well known and require no further description here. The invention does not reside in the particular test set, or in any particular set of testing signals. Rather, the invention resides in the procedure of disconnecting the EEC from circuit so that the engine can be tested in the static condition. It further resides in testing the individual circuits one at a time to determine in which of the circuits a fault resides. Thus, the fault can be specifically and uniquely identified, and this can be done without the use of ohmeters, voltmeters, ammeters or the like whose use in testing circuit can cause damage to the pins of the various plugs in the system. In addition, the signals, or the amplitudes of the signals, voltmeters, ammeters, ohmeters, etc., which are used in typical testing procedures at the present date, can damage the instruments or sensors while they are being tested. The present method avoids these disadvantages.

Although a particular embodiment has been described, this was for the purpose of describing, but not limiting, the invention. Various modifications, which will come readily to the mind of one skilled in the art, are within the scope of the invention as defined in the appended claims.

We claim:

1. A method of troubleshooting, with a test set, a fuel control system in an aircraft which has interfacing connectors with an engine on one side and airframe instruments on the other side, a plurality of LRU's in the engine, specific conductors connected, at one end thereof, to each LRU, the other end of said conductors forming an engine harness, said engine harness being split into an engine/airframe interface portion whose connectors are connected to separate positions of a multiposition interface plug, a mating multiposition interface receptacle being connected to said multiposition interface plug to airframe instruments;

said fuel control system comprising an electronic engine control (EEC);

said engine harness being further split into an EEC harness portion connected to a separate position of a multiposition EEC plug connected to a mating multiposition EEC receptacle mounted on said EEC;

a trim plug mounted on a mating trim plug receptacle on said EEC;

said test set comprising a first harness, respective connectors of said first harness being connected to a first test receptacle for mating engagement with said multiposition bulkhead plug, and other connectors of said first harness being connected to a first test plug for mating engagement with said mating multiposition bulkhead receptacle;

said test set further comprising a second harness, respective connectors of said second harness being connected to a second test receptacle for mating engagement with said multiposition EEC plug, and other connectors of said second harness being connected to a second test plug for mating engagement with said mating trim plug receptacle;

said method comprising:

disconnecting the mating multiposition bulkhead receptacle from said multiposition bulkhead plug and connecting said first test receptacle to said multiposition bulkhead plug and said first test plug to said mating multiposition bulkhead receptacle;

disconnecting said multiposition EEC plug from said mating multiposition EEC receptacle and connecting said second test receptacle to said multiposition EEC plug;

connecting said second test plug to said mating trim plug receptacle;

testing the circuits of said fuel control system one at a time by sending signals from said test set through said connectors of said first and second harness one at a time and receiving signals to determine if a fault exists in the respective circuits.

2. A method as defined in claim 1 wherein, if it is shown that a fault exists when a signal is sent through said first harness, through said first test receptacle, and through said multiposition bulkhead plug, then it is known that the fault exists either in a respective one of said LRU's or in the connector leading to said respective LRU;

said method further comprising the step of testing said LRU and, if said respective LRU is found faulty, replacing said respective LRU; or if said respective LRU is not found faulty, then determining that the fault is in the connector leading to said respective LRU.

3. A method as defined in claim 1 wherein, if a fault is located when a signal is sent through said first harness through said first test plug through said mating multiposition bulkhead receptacle, then it is known that the fault exists either in a respective one of said airframe instruments or in the connector leading to said respective airframe instrument;

said method further comprising testing said respective airframe instrument and if said respective airframe instrument is found faulty replacing said respective airframe instrument; or if said respective airframe instrument is not found faulty, then determining that the fault is in the conductor leading to said respective airframe instrument.

4. A method as defined in claim 1, wherein said electronic fuel control system comprises a hydro-mechanical unit and wherein said method comprises, before making the connections as defined in claim 1, ascertaining that the said hydro-mechanical unit and associated parts are serviceable and if not, replacing the faulty unit or part; or if no faults are found in the hydro-mechanical unit and associated parts, conducting the test as defined in claim 1.

* * * * *